(12) United States Patent
Salatino et al.

(10) Patent No.: US 8,736,001 B2
(45) Date of Patent: May 27, 2014

(54) FINGER SENSOR INCLUDING ENCAPSULATING LAYER OVER SENSING AREA AND RELATED METHODS

(75) Inventors: Matthew Salatino, Green Cove Springs, FL (US); Anthony Iantosca, Windermere, FL (US)

(73) Assignee: Authentec, Inc., Melbourne, FL (US)

( * ) Notice: Subject to any disclaimer, the term of this patent is extended or adjusted under 35 U.S.C. 154(b) by 355 days.

(21) Appl. No.: 13/163,108

(22) Filed: Jun. 17, 2011

(65) Prior Publication Data

US 2011/0309482 A1   Dec. 22, 2011

Related U.S. Application Data

(60) Provisional application No. 61/356,331, filed on Jun. 18, 2010.

(51) Int. Cl.
*H01L 21/76* (2006.01)

(52) U.S. Cl.
USPC .................. 257/415; 257/773; 257/E21.502; 257/678; 257/680; 345/173; 345/174; 438/106; 438/51; 382/124

(58) Field of Classification Search
USPC .................................. 345/173; 257/678, 680
See application file for complete search history.

(56) References Cited

U.S. PATENT DOCUMENTS

| | | | |
|---|---|---|---|
| 5,887,343 A | 3/1999 | Salatino et al. | 29/833 |
| 5,963,679 A | 10/1999 | Setlak | 382/312 |
| 6,259,804 B1 | 7/2001 | Setlak et al. | 382/124 |
| 6,347,040 B1 | 2/2002 | Fries et al. | |
| 6,512,381 B2 | 1/2003 | Kramer | 324/658 |
| 6,636,053 B1 | 10/2003 | Gozzini | 324/658 |
| 6,646,316 B2 | 11/2003 | Wu et al. | 257/434 |
| 6,924,496 B2 | 8/2005 | Manansala | 250/556 |
| 6,950,541 B1 | 9/2005 | Setlak et al. | 382/126 |
| 7,090,139 B2 | 8/2006 | Kasuga et al. | 235/494 |
| 7,099,496 B2 | 8/2006 | Benkley, III | 382/124 |
| 7,393,711 B2 | 7/2008 | Bolis et al. | 438/51 |
| 2005/0031174 A1 | 2/2005 | Ryhanen et al. | 382/124 |
| 2005/0089202 A1 | 4/2005 | Setlak et al. | 382/124 |
| 2005/0139685 A1 | 6/2005 | Kozlay | 235/492 |
| 2006/0034499 A1 | 2/2006 | Shinoda et al. | |

(Continued)

FOREIGN PATENT DOCUMENTS

| | | | | |
|---|---|---|---|---|
| EP | 0789334 | 8/1997 | | G07C 9/00 |
| EP | 1220139 | 7/2002 | | G06K 9/20 |

(Continued)

OTHER PUBLICATIONS

Database WPI, Week 200332, Thomson Scientific, London, GB, AN 2003-340178, Nov. 2002, pp. 1-2.

(Continued)

*Primary Examiner* — Eva Yan Montalvo
(74) *Attorney, Agent, or Firm* — Allen, Dyer, Doppelt, Milbrath & Gilchrist, P.A.

(57) ABSTRACT

A fingerprint sensor may include a substrate, and a finger sensing IC on the substrate and including a finger sensing area on an upper surface thereof for sensing an adjacent finger. The fingerprint sensor may include an encapsulating material on the finger sensing IC and covering the finger sensing area, and a bezel adjacent the finger sensing area and on an uppermost surface of the encapsulating layer.

43 Claims, 5 Drawing Sheets

(56) References Cited

U.S. PATENT DOCUMENTS

| | | | |
|---|---|---|---|
| 2006/0050935 A1 | 3/2006 | Bustgens et al. | 382/124 |
| 2007/0086630 A1 | 4/2007 | Setlak et al. | 382/124 |
| 2008/0049980 A1 | 2/2008 | Castaneda et al. | 382/115 |
| 2008/0150050 A1 | 6/2008 | Chou et al. | 257/415 |

FOREIGN PATENT DOCUMENTS

| | | | | |
|---|---|---|---|---|
| JP | H11185020 | | 7/1999 | |
| JP | 2002048507 | | 2/2002 | |
| JP | 2002516439 | | 6/2002 | |
| JP | 2006014908 | | 1/2006 | |
| JP | 2008113894 | | 5/2008 | |
| SE | 519304 | * | 2/2003 | |
| WO | 2004093008 | | 10/2004 | |
| WO | 2007/047748 | | 4/2007 | G06K 9/00 |

OTHER PUBLICATIONS

Maltoni et al., "Handbook of fingerprint recognition", Jan. 2003, pp. 59-64.

Ratha et al., "Automatic fingerprint recognition systems, PASSAGE", Jan. 2003, pp. 37-44.

\* cited by examiner

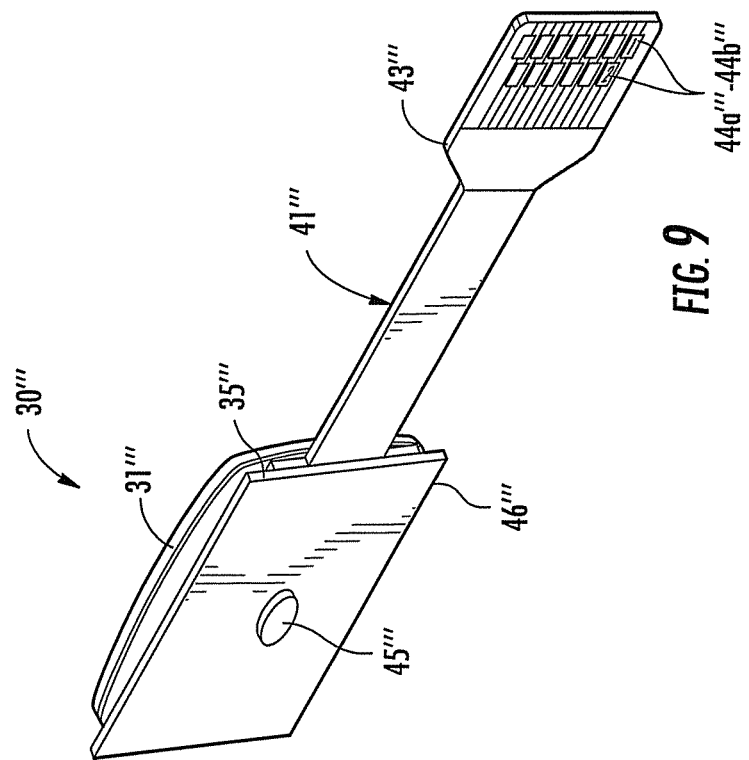
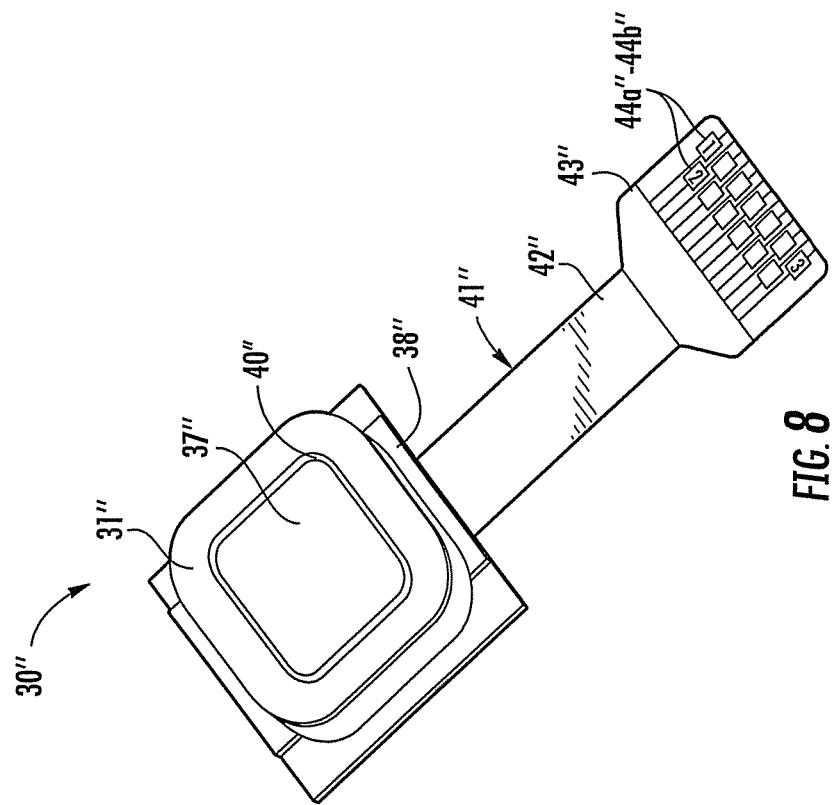

FINGER SENSOR INCLUDING ENCAPSULATING LAYER OVER SENSING AREA AND RELATED METHODS

RELATED APPLICATION

This application claims priority to U.S. Provisional Application Ser. No. 61/356,331 filed Jun. 18, 2010, the contents of which are hereby incorporated by reference in their entirety.

FIELD OF THE INVENTION

The present invention relates to the field of electronics, and, more particularly, to the field of finger sensors including finger sensing integrated circuits, and associated manufacturing methods.

BACKGROUND OF THE INVENTION

Sensors including integrated circuits (ICs) that directly sense the physical properties of objects in the sensor's environment have come into widespread use in electronic equipment. These ICs are desirably in close proximity to the external environments they measure, but they should not be damaged by the mechanical and/or electrical events that an external environment can apply.

One type of such sensing is finger sensing and associated matching that have become a reliable and widely used technique for personal identification or verification. In particular, a common approach to fingerprint identification involves scanning a sample fingerprint or an image thereof and storing the image and/or unique characteristics of the fingerprint image. The characteristics of a sample fingerprint may be compared to information for reference fingerprints already in a database to determine proper identification of a person, such as for verification purposes.

A particularly advantageous approach to fingerprint sensing is disclosed in U.S. Pat. Nos. 5,963,679 and 6,259,804, assigned to the assignee of the present application, the entire contents of which are incorporated herein by reference. The fingerprint sensor is an integrated circuit sensor that drives the user's finger with an electric field signal and senses the electric field with an array of electric field sensing pixels on the integrated circuit substrate. Additional finger sensing integrated circuits and methods are disclosed in U.S. Patent Application Publication No. 2005/0089202 entitled "Multi-biometric finger sensor including electric field sensing pixels and associated methods", also assigned to the assignee of the present application, and the entire contents of which are incorporated herein by reference.

A number of prior art references disclose various types of packaging of IC sensors. For example, U.S. Pat. No. 6,646,316 to Wu et al. discloses an optical sensor including a sensing die with bond pads on an upper surface thereof. A flexible circuit board is coupled to the bond pads, and has an opening over the sensing surface. A transparent glass layer covers the opening in the flexible circuit board. U.S. Pat. No. 6,924,496 to Manansala discloses a similar flexible circuit attachment to a fingerprint sensor, but leaves the area above the surface open.

U.S. Pat. No. 7,090,139 to Kasuga et al. discloses a smart card including a fingerprint sensor having bond pads attached to thin wiring film, and also including a window or opening above the sensing surface. U.S. Patent Application Publication No. 2005/0139685 to Kozlay discloses a similar arrangement for a fingerprint sensor.

Some fingerprint sensors are based on thin film technology, such as disclosed in U.S. Patent Application Publication No. 2006/0050935 to Bustgens et al. Other fingerprint sensors may include sensing elements on a flexible substrate, such as disclosed in U.S. Pat. No. 7,099,496 to Benkley, III. These sensors may be slightly more rugged than integrated circuit based sensors, but may have performance shortcomings.

U.S. Patent Application Publication No. 2005/0031174 to Ryhanen et al. discloses a flexible circuit board covering an application specific integrated circuit (ASIC) for capacitive electrode fingerprint sensing, and wherein the sensing electrodes are on the surface of the flexible substrate and covered with a thin protective polymer layer. In some embodiments, the sensor may wrap the flexible circuit around to the back side of the ASIC for attachment to a circuit board in a ball grid form.

U.S. Pat. No. 5,887,343, assigned to the assignee of the present invention, discloses an embodiment of a fingerprint sensor package that includes a layer over the finger sensing area of a finger sensing IC. A chip carrier, having an opening for the sensing area, is coupled, either capacitively or electrically, to the bond pads on the IC via peripheral regions of the transparent layer.

Finger sensing ICs are currently used on some cellular telephone handsets to capture fingerprints for user identification and to capture finger motions for menu navigation. Standard IC packaging methods that completely enclose the silicon chip are not used with these sensors because the sensing fields the sensors use to measure the fingerprint (e.g., electric fields, thermal fields, etc.) do not pass effectively through the package. For these sensors in today's systems, the IC or chip is typically packaged such that the finger can directly contact the passivation layer on the chip surface during the reading operation. For protection from physical damage during storage and transport (in a pocket or purse) the handsets are typically designed to fold closed when not in operation, protecting the sensor assembly which is mounted on an inside surface of the folding device.

There are many situations, however, where it may be preferable to be able to mount the sensor on an unprotected external surface of the handset. This would allow the sensor to be used without opening the clamshell handset, and would allow IC sensors to be used on handsets that do not fold closed, such as the so-called "candy bar" phones.

Unfortunately, the use of a finger sensing IC exposed on a device's external surface will likely subject the sensor to mechanical and/or electrical stresses not seen by a sensor that has a folding cover over it during storage. For example, a device in a pocket or purse will be subject to scratching, abrasion, point impact, continuous point pressure, and shear impact forces. The packaging technologies used for sensors in closeable cases are unlikely to provide adequate protection for the silicon chip.

SUMMARY OF THE INVENTION

In view of the foregoing background, it is therefore an object of the present invention to provide a finger sensor with enhanced packaging features and related methods.

This and other objects, features and advantages in accordance with the present invention are provided by a fingerprint sensor that may comprise a substrate, and a finger sensing IC on the substrate and comprising a finger sensing area on an upper surface thereof for sensing an adjacent finger. The fingerprint sensor may also include an encapsulating material on the finger sensing IC and covering the finger sensing area, and a bezel adjacent the finger sensing area and on an uppermost surface of the encapsulating layer. Advantageously, the fingerprint sensor may have reduced packaging and mechanical robustness.

More specifically, the encapsulating material may comprise a body portion covering the finger sensing area, and a flange portion extending from the periphery of the body portion, the bezel being on the flange portion. Outer surfaces of the bezel may be completely exposed, and the finger sensing area may be completely covered by the encapsulating material.

In some embodiments, the finger sensing area may comprise an array of electric field sensing electrodes carried by the upper surface of the finger sensing IC. The fingerprint sensor may further comprise at least one drive circuit coupled to the bezel so that the bezel defines a drive electrode. The fingerprint sensor may also further comprise at least one electrostatic discharge (ESD) circuit coupled to the bezel so that the bezel also defines an ESD electrode.

In other embodiments, the fingerprint sensor may include a flexible circuit layer on the substrate and comprising a connector portion. The flexible circuit layer may be on an opposite major surface of the substrate from that of the finger sensing IC. The fingerprint sensor may also include a switch carried by the flexible circuit layer.

For example, the bezel may comprise a solid metallic ring. Alternatively, the bezel may comprise an electrically conductive layer on the encapsulating material. The fingerprint sensor may further comprise at least one of a plurality of bond wires, a fan out circuitry interconnection, a flip chip interconnection, and a chip-on-tape interconnection for coupling the substrate and the finger sensing IC and being embedded in the encapsulating material.

Another aspect is directed to a method of making a fingerprint sensor. The method may include positioning a finger sensing IC on a substrate and comprising a finger sensing area on an upper surface thereof for sensing an adjacent finger, forming an encapsulating material on the finger sensing IC and covering the finger sensing area, and positioning a bezel adjacent the finger sensing area and on top of the encapsulating layer for driving the adjacent finger.

BRIEF DESCRIPTION OF THE DRAWINGS

FIG. 8 is a perspective view of another embodiment of the finger sensor, according to the present invention.

FIG. 9 is a perspective view of yet another embodiment of the finger sensor, according to the present invention.

DETAILED DESCRIPTION OF THE PREFERRED EMBODIMENTS

Figure 1:
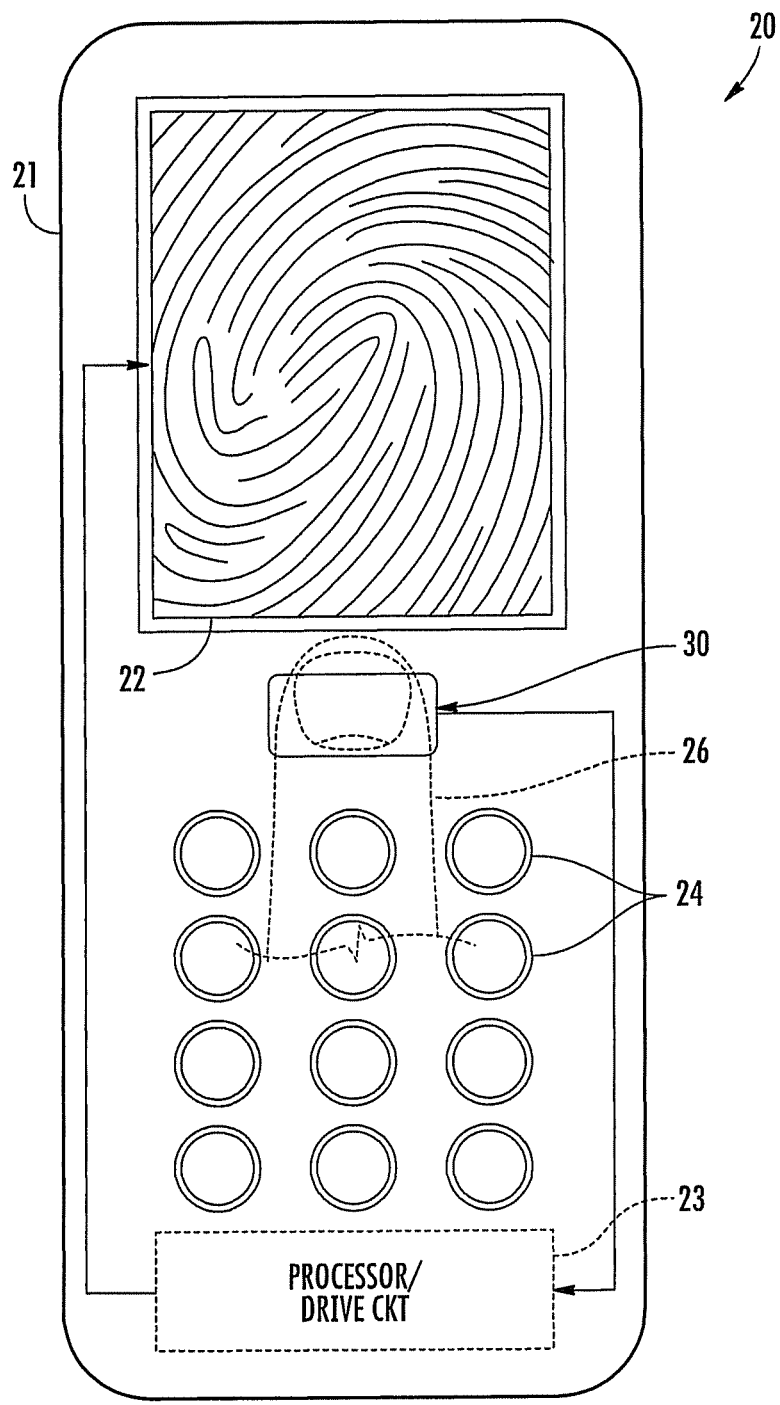
FIG. 1 is a schematic plan view of a cellular telephone including a finger sensor, according to the present invention.
Figure 2:
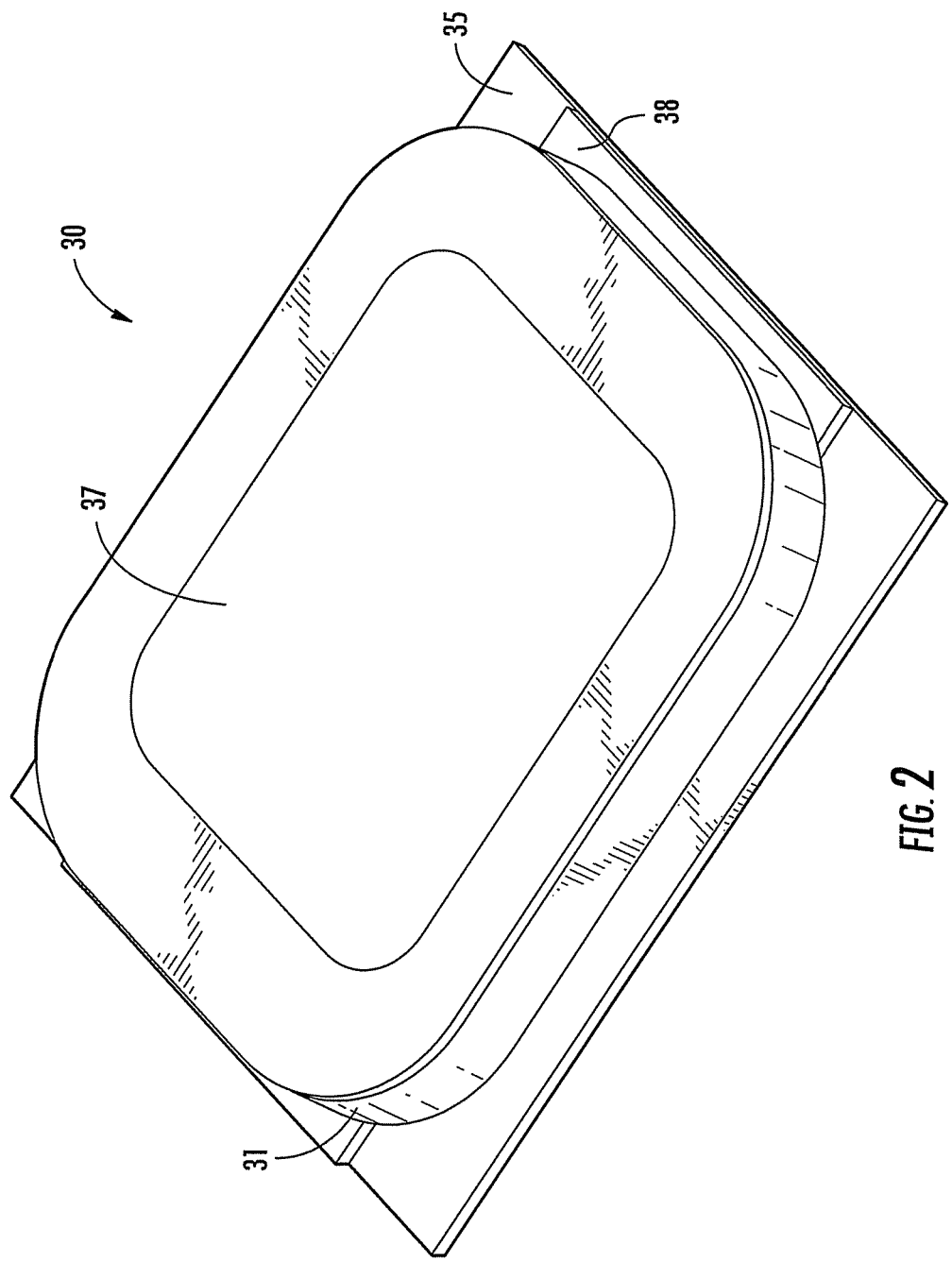
FIG. 2 is a perspective view of the finger sensor, according to the present invention.
Figure 3:
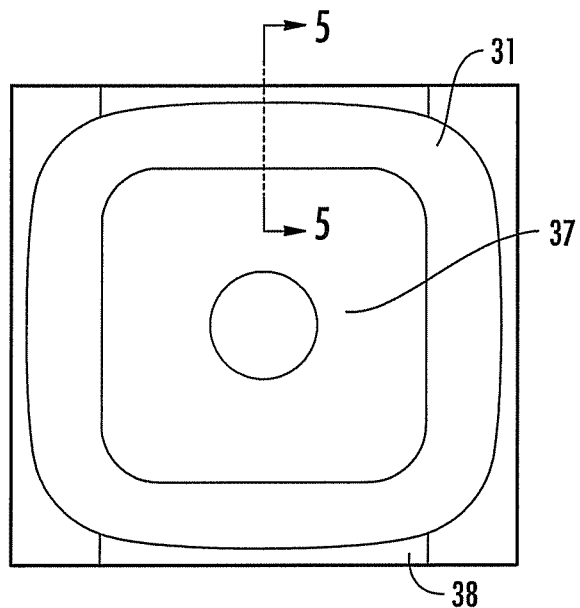
FIG. 3 is a plan top view of the finger sensor of FIG. 2.
Figure 4:
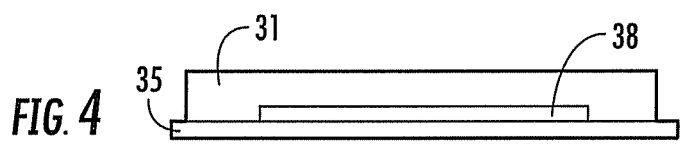
FIG. 4 is a side view of the finger sensor of FIG. 2.
Figure 5:
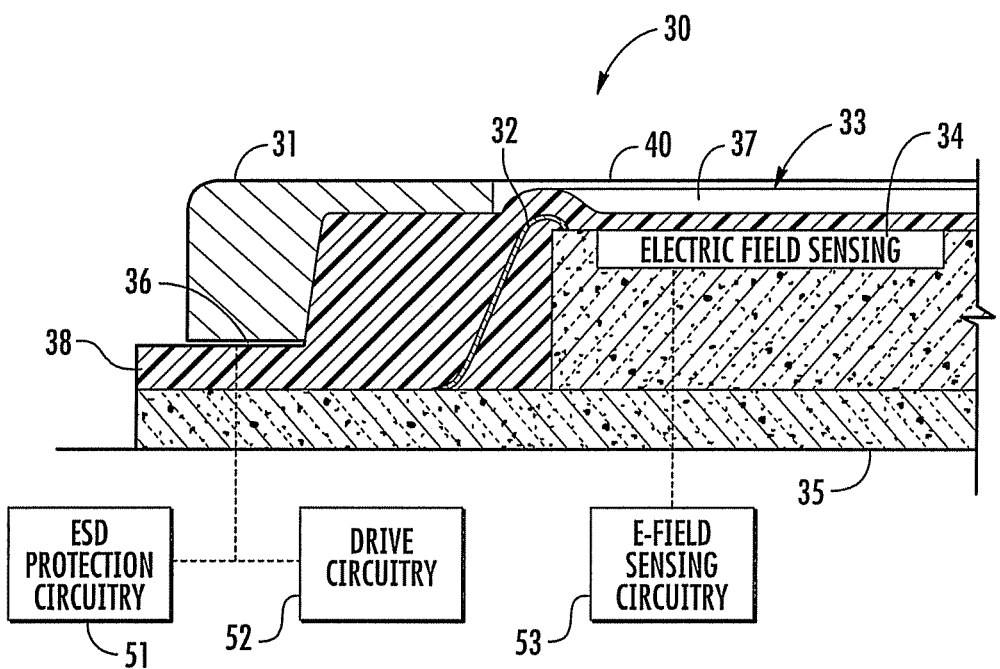
FIG. 5 is a cross-sectional view of the finger sensor of FIG. 3 taken along lines 5-5.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Referring initially to FIGS. 1-5, embodiments of a finger sensor 30 in accordance with the invention are now described. The finger sensor 30 is illustratively mounted on an exposed surface of a candy bar-type cellular telephone 20. The illustrated candy bar-type cellular telephone 20 is relatively compact and does not include a flip cover or other arrangement to protect the finger sensor 30 as may be done in other types of cellular phones. Of course, the finger sensor 30 can also be used with these other more protective types of cell phones, as will be appreciated by those skilled in the art. The finger sensor 30 can also be used with other portable and stationary electronic devices as well. The increased durability and ruggedness of the finger sensor 30 may permit its widespread use even when exposed.

The cellular phone 20 includes a housing 21, a display 22 carried by the housing, and processor/drive circuitry 23 also carried by the housing and connected to the display and to the finger sensor 30. An array of input keys 24 are also illustrated provided and used for typical cell phone dialing and other applications as will be appreciated by those skilled in the art.

The finger sensor 30 may be of the slide type where the user's finger 26 slides over the sensing area to generate a sequence of fingerprint images. Alternatively, the finger sensor 30 could be of the static placement type, where the user simply places his finger 26 onto the sensing surface to generate a fingerprint image. Of course, the finger sensor 30 may also include circuitry embedded therein and/or in cooperation with the processor/drive circuit 23 to provide menu navigation and selection functions as will be appreciated by those skilled in the art.

As shown perhaps best in FIGS. 2-5, the finger sensor 30 illustratively includes a substrate 35, a finger sensing IC 34 mounted on the substrate, and bond wires 32 coupling the substrate and the finger sensing IC. In other embodiments, the bond wires 32 may be replaced with or supplemented with other interconnection methods, such as fan out circuitry, flip chip, or chip on tape. The finger sensing IC 34 illustratively includes a finger sensing area on an upper surface thereof. The finger sensing area may comprise an array of sensing electrodes carried by the upper surface of the finger sensing IC 34, such as for electric field finger sensing, for example, as disclosed in U.S. Pat. Nos. 5,963,679 and 6,259,804, the entire contents of which are incorporated herein by reference.

The finger sensor 30 illustratively includes an encapsulating layer 33 encapsulating the finger sensing IC 34 and covering the finger sensing area. In other words, the finger sensing IC 34 senses the fingerprint of the user through the encapsulating layer 33. To that purpose, the encapsulating layer 33 illustratively includes a recessed portion 37 for receiving the finger of the user. In particular, the recessed portion 37 is thin for permitting sensing therethrough. For example, the thickness may in a range of 2-500 microns, and more preferably in a range of 10-250 microns. The encapsulating layer 33 also illustratively includes a peripheral flange portion 38 on the substrate 35 and surrounding the finger sensing IC 34 and the bond wires 32. Moreover, the encapsulating layer 33 illustratively includes a raised ramp bump portion 40 coupling the flange portion and the recessed portion 37, which aids in keeping the user's finger in proper position and which provides protection against ESD coupling to the bond pads, the wire bonds, or other interconnection device.

As shown in the illustrated embodiment, the raised ramp bump portion 40 has increased thickness as compared to the recessed portion 37, thereby protecting the bond wires 32 from the electrical coupling. In other embodiments, the raised ramp bump portion 40 may have equal thickness with the recessed portion 37, i.e. there may be no raised bump portion. Also, the flange portion 38 illustratively includes an inner block portion, which provides structural support to the bezel 31. In some embodiments, the encapsulating layer 33 provides a hermetic seal with the substrate, thereby adding extra protection to the finger sensor from contaminants and also providing mechanical damage protection (or mechanical robustness).

The finger sensor 30 illustratively includes a bezel 31 on the encapsulating layer 38, i.e. on top of the encapsulating layer. More specifically, the bezel rests on the flange portion 38 and may be affixed thereto using an adhesive layer therebetween or a mechanical interference arrangement.

In embodiments of the finger sensor 30 that use electric field sensing electrodes, the bezel 31 may be coupled to circuitry to serve as a drive electrode for driving the finger of the user. Also, the finger sensor 30 illustratively includes conductive traces 36 on the substrate 35 for coupling the bezel 31 thereto. In other words, in these embodiments, the finger sensor 30 does not include any wires coupled to the bezel 31, which enhances the mechanical strength of the device. For example, the bezel 31 may comprise a metal or another conductive material. In some embodiments, ESD protection circuitry may be coupled to the bezel 31.

The finger sensor 30 may further include at least one electronic component carried by the substrate 35. For example, the at least one electronic component may comprise at least one of a discrete component and another IC.

The finger sensor 30 may further include conductive traces (not shown) on the opposite side of the substrate 35 for providing connections to an external circuit. The conductive traces may form a land grid array or ball grid array package, for example.

Advantageously, the finger sensor 30 provides for a reduced size in packaging. For example, the finger sensor 30 may have dimensions of 8.0 mm×8.0 mm×1.2 mm. The bezel 31 may have an area of 10-30 mm².

Moreover, in embodiments of the finger sensor 30 that use electric field sensing electrodes, the finger sensor illustratively includes ESD protection circuitry 51, drive circuitry 52, and e-field sensing circuitry 53 coupled to the finger sensing IC 34 via the conductive traces 36 on the substrate 35. These circuits cooperate with the finger sensing IC 34 and the bezel 31 to sense the fingerprint of the user and to provide ESD protection.

Figure 6:
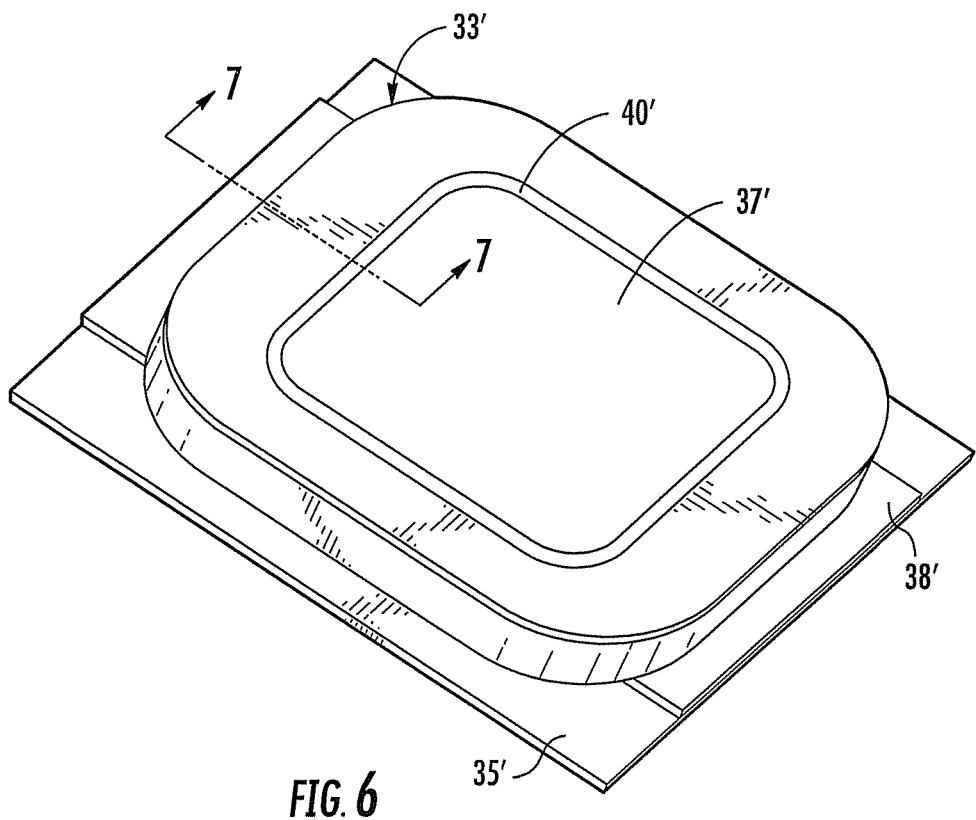
FIG. 6 is a perspective view of another embodiment of the finger sensor, according to the present invention.
Figure 7:
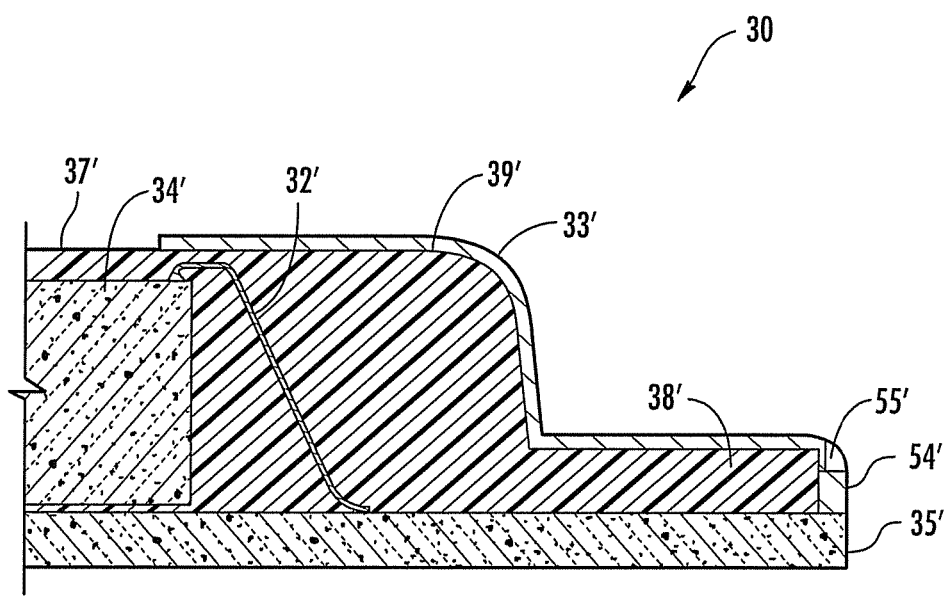
FIG. 7 is a cross-sectional view of the finger sensor of FIG. 6 taken along lines 7-7.

Referring now to FIGS. 6-7, another embodiment of the finger sensor 30 is now described. In this embodiment of the finger sensor 30', those elements already discussed above with respect to FIGS. 1-5 are given prime notation and most require no further discussion herein. This embodiment differs from the previous embodiment in that the finger sensor 30' does not include a separate conductive bezel. Instead, in these embodiments, the finger sensor 30' illustratively includes an electrically conductive plating layer 39' on the encapsulating layer 38' to provide the drive ring and/or the ESD electrode. Furthermore, the surface of the encapsulating layer 38' may be patterned or textured to permit better adhesion for the electrically conductive plating layer 39'. The electrically conductive plating layer 39' extends over the bond wires 32' to provide good ESD protection to the bond wire connections, as will be appreciated by those skilled in the art. Moreover, the encapsulating layer 38' has no thinning over the finger sensing IC 34', i.e. there is no recessed portion as in the above embodiments.

The electrically conductive plating layer 39' extends over the radiused edge of the encapsulating layer 38' and over the flange portion 38'. The finger sensor 30' also illustratively includes an electrode 54' coupling the electrically conductive plating layer 39' to the conductive traces on the substrate 35', and conductive epoxy 55' providing mechanical strength to the connection. Advantageously, this provides a low resistance circuit from the top of the finger sensor 30' package to the bottom.

Referring now to FIG. 8, another embodiment of the finger sensor 30 is now described. In this embodiment of the finger sensor 30", those elements already discussed above with respect to FIGS. 1-5 are given double prime notation and most require no further discussion herein. This embodiment differs from the previous embodiment in that the finger sensor 30" further includes flexible circuit 41" coupled to the substrate 35". As will be appreciated by those skilled in the art, the flexible circuit 41" is coupled using surface mounted technology, for example, to the substrate 35". The flexible circuit 41" illustratively includes a flex portion 42", and a connector portion 43" coupled thereto. The connector portion 43" illustratively includes a plurality of conductive traces 44a"-44b" thereon for providing an external connection, such as a zero insertion force (ZIF) connector interface.

In certain embodiments, the housing (not shown) of the cellular phone may include a recessed portion for receiving the finger sensor 30" and an opening therein for receiving the flexible circuit 41", which is to be coupled to an internal IC board carried within.

Referring now to FIG. 9, another embodiment of the finger sensor 30 is now described. In this embodiment of the finger sensor 30''', those elements already discussed above with respect to FIG. 8 are given triple prime notation and most require no further discussion herein. This embodiment differs from the previous embodiment in that the finger sensor 30''' further includes a second substrate 46''' mounted on the flexible circuit 41''', and a mechanical button switch 45''' on an opposing side of the second substrate. For example, the mechanical button switch 45''' may comprise a hermetically sealed button switch (or vented button switch) that can provide power on/off or other functions as will be appreciated by those skilled in the art. More specifically, the second substrate 46''' may comprise conductive traces thereon for coupling to the same on the flexible circuit 41'''.

In certain embodiments, the housing (not shown) of the cellular phone may include a recessed portion for mounting the finger sensor 30'. The finger sensor 30''' may be movably vertically displaced by the user as it sits in the recessed portion for selectively depressing the mechanical button switch 45'''. In other words, the user may operate the finger sensor 30''' as a typical mechanical switch. Also, in other embodiments, the connector portion 43''' may include a plurality of conductive traces 44a'''-44b''' for coupling the mechanical button switch 45''' to external circuitry.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A fingerprint sensor comprising:
a substrate;
a finger sensing integrated circuit (IC) on said substrate and comprising a finger sensing area on an upper surface thereof for sensing an adjacent finger, said finger sensing area comprising an array of electric field sensing electrodes;
an encapsulating material on said finger sensing IC and covering said finger sensing area; and
a bezel adjacent the finger sensing area and on an uppermost surface of said encapsulating material.

2. The fingerprint sensor of claim 1 wherein said encapsulating material comprises a body portion covering said finger sensing area, and a flange portion extending from the periphery of said body portion; and wherein said bezel is on said flange portion.

3. The fingerprint sensor of claim 1 wherein outer surfaces of said bezel are completely exposed; and wherein said finger sensing area is completely covered by said encapsulating material.

4. The fingerprint sensor of claim 1 further comprising at least one drive circuit coupled to said bezel so that said bezel defines a drive electrode.

5. The fingerprint sensor of claim 1 further comprising:
a flexible circuit layer on said substrate and comprising a connector portion, said flexible circuit layer being on an opposite major surface of said substrate from that of said finger sensing IC; and
a switch carried by said flexible circuit layer.

6. The fingerprint sensor of claim 1 wherein said bezel comprises a solid metallic ring.

7. The fingerprint sensor of claim 1 wherein said bezel comprises an electrically conductive layer on said encapsulating material.

8. The fingerprint sensor of claim 1 further comprising at least one of a plurality of bond wires, a fan out circuitry interconnection, a flip chip interconnection, and a chip-on-tape interconnection for coupling said substrate and said finger sensing IC and being embedded in said encapsulating material.

9. A fingerprint sensor comprising:
a substrate;
a finger sensing integrated circuit (IC) on said substrate and comprising a finger sensing area on an upper surface thereof for sensing an adjacent finger, said finger sensing area comprising an array of electric field sensing electrodes;
an encapsulating material on said finger sensing IC and covering said finger sensing area;
a bezel adjacent the finger sensing area and on an uppermost surface of said encapsulating material; and
at least one electrostatic discharge (ESD) circuit coupled to said bezel so that said bezel defines an ESD electrode.

10. The fingerprint sensor of claim 9 wherein said encapsulating material comprises a body portion covering said finger sensing area, and a flange portion extending from the periphery of said body portion; and wherein said bezel is on said flange portion.

11. The fingerprint sensor of claim 9 wherein outer surfaces of said bezel are completely exposed; and wherein said finger sensing area is completely covered by said encapsulating material.

12. The fingerprint sensor of claim 9 further comprising at least one drive circuit coupled to said bezel so that said bezel also defines a drive electrode.

13. The fingerprint sensor of claim 9 further comprising:
a flexible circuit layer on said substrate and comprising a connector portion, said flexible circuit layer being on an opposite major surface of said substrate from that of said finger sensing IC; and
a switch carried by said flexible circuit layer.

14. The fingerprint sensor of claim 9 wherein said bezel comprises an electrically conductive layer on said encapsulating material.

15. A method of making a fingerprint sensor comprising:
positioning a finger sensing integrated circuit (IC) on a substrate, the finger sensing IC comprising a finger sensing area on an upper surface thereof for sensing an adjacent finger;
forming an encapsulating material on the finger sensing IC and to cover the finger sensing area;
positioning a bezel to be adjacent the finger sensing area and to be on an uppermost surface of the encapsulating material; and
coupling at least one drive circuit to the bezel so that the bezel defines a drive electrode.

16. The method of claim 15 wherein forming the encapsulating material comprises forming the encapsulating material to comprise a body portion covering the finger sensing area, and a flange portion extending from the periphery of the body portion, the bezel being positioned on the flange portion.

17. The method of claim 15 wherein positioning the bezel comprises positioning outer surfaces of the bezel to be completely exposed; and wherein forming the encapsulating material comprises forming the encapsulating material so that the finger sensing area is completely covered thereby.

18. The method of claim 15 further comprising coupling at least one electrostatic discharge (ESD) circuit to the bezel so that the bezel also defines an ESD electrode.

19. The method of claim 15 further comprising:
coupling a flexible circuit layer on the substrate and comprising a connector portion, the flexible circuit layer being on an opposite major surface of the substrate from that of the finger sensing IC; and
positioning a switch to be carried by the flexible circuit layer.

20. A fingerprint sensor comprising:
a substrate;
a finger sensing integrated circuit (IC) on said substrate and comprising a finger sensing area on an upper surface thereof for sensing an adjacent finger;
an encapsulating material on said finger sensing IC and covering said finger sensing area;
a bezel adjacent the finger sensing area and on an uppermost surface of said encapsulating material; and
at least one drive circuit coupled to said bezel so that said bezel defines a drive electrode.

21. The fingerprint sensor of claim 20 wherein said encapsulating material comprises a body portion covering said finger sensing area, and a flange portion extending from the periphery of said body portion; and wherein said bezel is on said flange portion.

22. The fingerprint sensor of claim 20 wherein outer surfaces of said bezel are completely exposed; and wherein said finger sensing area is completely covered by said encapsulating material.

23. A fingerprint sensor comprising:
a substrate;
a finger sensing integrated circuit (IC) on said substrate and comprising a finger sensing area on an upper surface thereof for sensing an adjacent finger;

an encapsulating material on said finger sensing IC and covering said finger sensing area;

a bezel adjacent the finger sensing area and on an uppermost surface of said encapsulating material; and at least one electrostatic discharge (ESD) circuit coupled to said bezel so that said bezel also defines an ESD electrode.

24. The fingerprint sensor of claim 23 wherein said encapsulating material comprises a body portion covering said finger sensing area, and a flange portion extending from the periphery of said body portion; and wherein said bezel is on said flange portion.

25. The fingerprint sensor of claim 23 wherein outer surfaces of said bezel are completely exposed; and wherein said finger sensing area is completely covered by said encapsulating material.

26. A fingerprint sensor comprising:

a substrate;

a finger sensing integrated circuit (IC) on said substrate and comprising a finger sensing area on an upper surface thereof for sensing an adjacent finger;

an encapsulating material on said finger sensing IC and covering said finger sensing area;

a bezel adjacent the finger sensing area and on an uppermost surface of said encapsulating material;

a flexible circuit layer on said substrate and comprising a connector portion, said flexible circuit layer being on an opposite major surface of said substrate from that of said finger sensing IC; and a switch carried by said flexible circuit layer.

27. The fingerprint sensor of claim 26 wherein said encapsulating material comprises a body portion covering said finger sensing area, and a flange portion extending from the periphery of said body portion; and wherein said bezel is on said flange portion.

28. The fingerprint sensor of claim 26 wherein outer surfaces of said bezel are completely exposed; and wherein said finger sensing area is completely covered by said encapsulating material.

29. A fingerprint sensor comprising:

a substrate;

a finger sensing integrated circuit (IC) on said substrate and comprising a finger sensing area on an upper surface thereof for sensing an adjacent finger;

an encapsulating material on said finger sensing IC and covering said finger sensing area; and a bezel adjacent the finger sensing area and on an uppermost surface of said encapsulating material, said bezel comprising a solid metallic ring.

30. The fingerprint sensor of claim 29 wherein said encapsulating material comprises a body portion covering said finger sensing area, and a flange portion extending from the periphery of said body portion; and wherein said bezel is on said flange portion.

31. The fingerprint sensor of claim 29 wherein outer surfaces of said bezel are completely exposed; and wherein said finger sensing area is completely covered by said encapsulating material.

32. A method of making a fingerprint sensor comprising:

positioning a finger sensing integrated circuit (IC) on a substrate, the finger sensing IC comprising a finger sensing area on an upper surface thereof for sensing an adjacent finger;

forming an encapsulating material on the finger sensing IC and to cover the finger sensing area;

positioning a bezel to be adjacent the finger sensing area and to be on an uppermost surface of the encapsulating material; and coupling at least one electrostatic discharge (ESD) circuit to the bezel so that the bezel also defines an ESD electrode.

33. The method of claim 32 wherein forming the encapsulating material comprises forming the encapsulating material to comprise a body portion covering the finger sensing area, and a flange portion extending from the periphery of the body portion, the bezel being positioned on the flange portion.

34. The method of claim 32 wherein positioning the bezel comprises positioning outer surfaces of the bezel to be completely exposed; and wherein forming the encapsulating material comprises forming the encapsulating material so that the finger sensing area is completely covered thereby.

35. A method of making a fingerprint sensor comprising:

positioning a finger sensing integrated circuit (IC) on a substrate, the finger sensing IC comprising a finger sensing area on an upper surface thereof for sensing an adjacent finger;

forming an encapsulating material on the finger sensing IC and to cover the finger sensing area;

positioning a bezel to be adjacent the finger sensing area and to be on an uppermost surface of the encapsulating material;

coupling a flexible circuit layer on the substrate and comprising a connector portion, the flexible circuit layer being on an opposite major surface of the substrate from that of the finger sensing IC; and positioning a switch to be carried by the flexible circuit layer.

36. The method of claim 35 wherein forming the encapsulating material comprises forming the encapsulating material to comprise a body portion covering the finger sensing area, and a flange portion extending from the periphery of the body portion, the bezel being positioned on the flange portion.

37. The method of claim 35 wherein positioning the bezel comprises positioning outer surfaces of the bezel to be completely exposed; and wherein forming the encapsulating material comprises forming the encapsulating material so that the finger sensing area is completely covered thereby.

38. A method of making a fingerprint sensor comprising:

positioning a finger sensing integrated circuit (IC) on a substrate, the finger sensing IC comprising a finger sensing area on an upper surface thereof for sensing an adjacent finger, the finger sensing area comprising an array of electric field sensing electrodes carried by the upper surface of the finger sensing IC;

forming an encapsulating material on the finger sensing IC and to cover the finger sensing area; and positioning a bezel to be adjacent the finger sensing area and to be on an uppermost surface of the encapsulating material.

39. The method of claim 38 wherein forming the encapsulating material comprises forming the encapsulating material to comprise a body portion covering the finger sensing area, and a flange portion extending from the periphery of the body portion, the bezel being positioned on the flange portion.

40. The method of claim 38 wherein positioning the bezel comprises positioning outer surfaces of the bezel to be completely exposed; and wherein forming the encapsulating material comprises forming the encapsulating material so that the finger sensing area is completely covered thereby.

41. A method of making a fingerprint sensor comprising:
positioning a finger sensing integrated circuit (IC) on a substrate, the finger sensing IC comprising a finger sensing area on an upper surface thereof for sensing an adjacent finger;
forming an encapsulating material on the finger sensing IC and to cover the finger sensing area;
forming a bezel to comprise a solid metallic ring; and
positioning the bezel to be adjacent the finger sensing area and to be on an uppermost surface of the encapsulating material.

42. The method of claim 41 wherein forming the encapsulating material comprises forming the encapsulating material to comprise a body portion covering the finger sensing area, and a flange portion extending from the periphery of the body portion, the bezel being positioned on the flange portion.

43. The method of claim 41 wherein positioning the bezel comprises positioning outer surfaces of the bezel to be completely exposed; and wherein forming the encapsulating material comprises forming the encapsulating material so that the finger sensing area is completely covered thereby.

\* \* \* \* \*